United States Patent [19]

Amariti et al.

[11] Patent Number: 4,714,670
[45] Date of Patent: Dec. 22, 1987

[54] DEVELOPER INCLUDING AN ALIPHATIC CYCLIC CARBONATE IN THE OIL PHASE EMULSION

[75] Inventors: Luigi Amariti, Voorhees; Llandro C. Santos, Cherry Hill, both of N.J.

[73] Assignee: Imperial Metal & Chemical Company, Philadelphia, Pa.

[21] Appl. No.: 871,833

[22] Filed: Jun. 9, 1986

[51] Int. Cl.$^4$ .................................................. G03C 5/00
[52] U.S. Cl. ...................................... 430/331; 430/154; 430/302; 430/309
[58] Field of Search ................. 430/302, 329, 331, 309

[56] References Cited

U.S. PATENT DOCUMENTS

| | | | |
|---|---|---|---|
| 2,754,279 | 7/1956 | Hall | 430/331 |
| 3,313,233 | 4/1967 | Uhlig et al. | 430/309 |
| 3,607,271 | 9/1971 | Helden et al. | 430/331 |
| 4,077,324 | 3/1978 | Pakansky et al. | 430/303 |
| 4,350,605 | 9/1982 | Hughett | 252/305 |
| 4,576,899 | 3/1986 | Amariti et al. | 430/331 |
| 4,623,611 | 11/1986 | West | 430/329 |

*Primary Examiner*—Charles L. Bowers, Jr.
*Assistant Examiner*—Terri Stevenson
*Attorney, Agent, or Firm*—Dressler, Goldsmith, Shore, Sutker & Milnamow, Ltd.

[57] ABSTRACT

Emulsion developers for diazo-sensitized printing plates are disclosed which are characterized by an oil phase containing a partially water-soluble aliphatic cyclic carbonate having the formula:

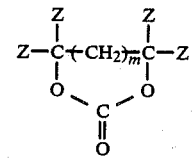

where n is an integar from 0-2, and Z is selected from hydrogen, $C_1$-$C_3$ alkyl, hydroxyl alkyl or chloroalkyl, chlorine, hydroxy or phenyl. The preferred carbonate is propylene carbonate.

13 Claims, No Drawings

DEVELOPER INCLUDING AN ALIPHATIC CYCLIC CARBONATE IN THE OIL PHASE EMULSION

DESCRIPTION

1. Technical Field

This invention relates to emulsion developers for an exposed, diazo-sensitized, lithographic printing plate.

2. Background Art

Emulsion developers for developing exposed, diazo-sensitized, lithographic printing plates are known. The purpose of these developers is to remove the photosensitive coating from the unexposed or non-image areas of the printing plate while strengthening the image areas by adhering thereto a layer of pigmented resin. The developer may also function to prepare the plate for the press as part of a printing process.

The known emulsion developers include an oil phase and an aqueous phase, as discussed below.

The oil phase includes a partially water soluble organic solvent which has dissolved therein a resinous material which adheres to the imaged areas of the printing plate, a surfactant to keep any pigment dispersed in the oil phase and to maintain the oil phase in emulsion, and, optionally, pigments which adhere with the resinous material to the imaged areas of the printing plate.

The aqueous phase contains water having dispersed therein protective colloids, finely divided particles, typified by a finely divided talc, and surfactants to keep these materials in suspension in the emulsion and to prevent the emulsified oil phase from coalescing in the aqueous phase of the emulsion.

The previously noted organic solvent is used in the oil phase in an amount in excess of that needed to saturate the aqueous phase of the emulsion. As a result, sufficient solvent remains in the oil phase to maintain the resinous material in solution in the oil phase of the emulsion.

Emulsion developers are illustrated in U.S. Pat. Nos. 3,313,233 issued Apr. 11, 1967 and 3,669,664 issued June 13, 1972 which discuss the various resins which can be emulsified in the developer and the solvents which are used therewith. Emulsion developers are also discussed in U.S. Pat. Nos. 3,615,791 issued Oct. 26, 1971 and 3,759,850 issued Sept. 18, 1973. The diazo-sensitized printing plates are discussed in U.S. Pat. No. 3,669,660 issued June 13, 1972.

Unfortunately, the known compositions are inadequate because the selected solvents are usually noxious or even toxic, such as glycol ethers, cyclohexanone, cyclohexanol, and the like. It is desirable to be able to use less annoying solvents. Also, the known emulsion developers do not adequately remove dark reaction products from the unexposed (non-image) areas, and as a result, the printing plates include some undesired background and do not print as cleanly as is desired.

DISCLOSURE OF INVENTION

In accordance with this invention, the known emulsion developers are modified by including therein, as the partially water soluble organic solvent component of the oil phase portion of the developer, an ethylene carbonate solvent. It is found that these aliphatic cyclic carbonate solvents, which will be discussed more fully hereinafter, will effectively dissolve the resinous materials used and will provide a superior job of removing the dark reaction products which are sometimes present in the unexposed portions of the photosensitive coating being developed. The carbonate solvents used herein are non-toxic, non-flammable, non-volatile and have little odor, but at the same time they are sufficiently water soluble to allow them to be satisfactorily washed out of the developed printing plate so that the deposited resinous material will remain essentially tack-free.

Preferred carbonate solvents for use in this invention are glycerine carbonate, ethylene carbonate and propylene carbonate. Propylene carbonate is particularly preferred because it is a good solvent for the normally solid resins used herein, it is partially water soluble so as to be easily washed out of the developed printing plate while still remaining adequately in the oil phase of the emulsion to retain the selected resin in solution therein, and it does an excellent job of removing the dark reaction products which may be present in the unexposed areas of the diazo sensitized lithographic printing plate while not removing the light exposed portions of the same plate. This ability to distinguish between these two different normally insoluble materials is unique for the carbonate solvents which are used herein.

As a matter of interest, the preferred propylene carbonate has an oral LD50 in rats of 29 grams per kilogram, and this is close to that of sucrose which is 29.7 grams per kilogram (see the Registry of Toxic Effects of Chemical Substances 1981-1982).

To more particularly define the aliphatic cyclic carbonate solvents which may be used herein, these have the formula:

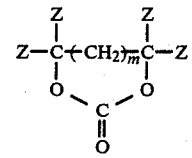

where n is an integar from 0-2, preferably 0, and Z is selected from hydrogen, $C_1$-$C_3$ alkyl, hydroxyl alkyl or chloroalkyl, chlorine, hydroxy or phenyl. The preferred cyclic aliphatic carbonate solvents have the formula:

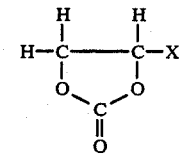

where X is selected from hydrogen, methyl and hydroxymethyl.

The preferred carbonate solvents have been named previously. Other useful carbonate solvents are illustrated by: 5-methyl-5-propyl-1,3-dioxane-2-one, 4,4,5,5-tetrachloro-1,3-dioxolan-2-one, 5,5-diethyl-1,3-dioxan-2-one, chloroethylene carbonate, 4,5-dichloro-1,3-dioxalan-2-one, 4,5-diphenyl-1,3-dioxol-2-one, and 1,3-dioxan-2-one.

The carbonate solvent used in this invention is employed in the same range of proportions previously used, namely, enough to saturate the aqueous phase of the emulsion while retaining enough in the oil phase to keep the resinous material therein in solution in that phase. In preferred practice, the carbonate solvent will be used in an amount of from 15% to 65%, preferably from 30% to 55% based on the total weight of water and solvent.

The diazo-sensitized lithographic printing plates are themselves conventional. These are constituted by an appropriate printing plate substrate, such as an aluminum plate, which has been coated with a solvent-soluble photopolymerizable coating of ethylenically unsaturated materials which are rendered sensitive to light, especially ultraviolet light, by means of a diazo sensitizer. The diazo-sensitizers are themselves well known, and are usually condensation products of formaldehyde and diazo diphenyl amine stabilized with a compound like zinc chloride. Diazo oxides are also used. The photopolymerizable coatings containing these diazo sensitizers are also well known.

Lithographic plates of the type under consideration are generally available in commerce, for example, illustrative plates can be obtained from Imperial Metal & Chemical Company, 2050 Byberry Road Philadelphia, Pa. 19116 under the designations S-130 and S-325.

Referring more particularly to the dark reaction products which have been noted, these are often present in the photosensitive portion of the lithographic plates as a result of aging or improper storage. These products are believed to be the result of dimerization and/or trimerization of diazo condensates and of the regressive reaction of the diazonium group itself. The solvents previously used have not been capable of adequately distinguishing between these products and the products of photolysis, and as a result, some of the pigmented resin has deposited in the unexposed areas producing an undesired background when the printing plate is used.

The resins which may be used are also conventional. Any normally solid resin which is soluble in the selected solvent can be used herein, as in the prior art. Shellac, nitrocellulose and phenolic resins have been used in the past. It is presently preferred to employ a relatively high molecular weight epoxy resin, such as the Shell Chemical Company product Epon 1007 which is a diglycidyl ether of bisphenol A having an average molecular weight of about 3800 and an epoxide equivalent weight of about 2900. These are normally solid soluble resins in which the available epoxy functionality is quite low. Acrylic copolymers and polyester resins are also appropriate resins and will serve to further illustrate suitable normally solid solvent-soluble resinous materials which are useful herein and which will resist the poor solvents usually employed in printing inks.

In normal practice, the above-described resins are used in an amount of from 0.5% to 20%, based on the weight of the carbonate solvent. In preferred practice, the proportion of resin will range from 1.0% to 10% of the weight of the carbonate solvent.

As will be evident, resin selection is primarily dictated by factors which are not a part of this invention, such as the resistance of that resin to the solvents used in the printing inks which are selected for use in the lithographic printing process.

Pigments are optional herein, but are normally used since they help to strengthen the exposed portions of the printing plate. While any finely divided pigment may be used, it is preferred to use pigments which are not regarded as possibly toxic. It is presently preferred to use D & C certified lakes, such as Indigotine, Color Number CL73015, Helindone Pink CN, Color Number C173360, and the like, or a D & C approved channel black.

The surfactants used may be of any desired character as is more fully illustrated in the Example. These may be cationic, anionic, or nonionic, nonionic surfactants being presently preferred. Usually one will choose a water insoluble emulsifying agent to help disperse the pigment in the oil phase, and a water soluble surfactant for the water phase to help maintain the stability of the emulsion. Surfactant selection is no different herein than it was in the prior art and will be well known to those skilled in the art.

Referring more particularly to the aqueous phase of the emulsion, it is desirable to include a finely divided agent which associates with the oil phase droplets to keep them from prematurely coalescing. Such agents are illustrated by finely ground talc, fumed silicas, finely ground clays, or combinations thereof.

An emulsion stabilizer may optionally be present in a small amount optional for that purpose, and 1,2-propylene glycol is now preferred.

Desensitizing agents and protective colloids are themselves well known in the art, which has been referred to. We prefer gum arabic or carboxymethyl cellulose.

The preparation of the emulsion phase is simple. Standard practice is simply to dissolve the resin the carbonate solvent, add the pigments and surfactants and mix in a ball mill or other suitable disperser to provide an intimate admixture. The water phase is equally simple to prepare and is mixed separately. The two phases are then brought together and mixed thoroughly to provide the desired emulsion.

All proportions herein are by weight, unless otherwise noted. The invention is illustrated in the Example of presently preferred practice which follows.

EXAMPLE 1

An oil phase was prepared in the manner previously noted to contain:

| Component | Grams |
| --- | --- |
| Diglycidyl ether of bisphenol A (see note 1) | 1.6 |
| Propylene carbonate | 13.6 |
| Nonionic surfactant (note 2) | 0.9 |
| Propylene glycol | 9.0 |
| Helindone Pink CN aluminum lake | 1.4 |

A water phase was separately prepared by mixing together the following:

| Component | Grams |
| --- | --- |
| Gum arabic (28% in water) | 35.0 |
| Water | 13.0 |
| Nonionic surfactant (note 3) | 0.2 |
| Nonionic surfactant (note 4) | 0.2 |
| Fumed silica | 0.2 |
| Finely divided talc (passes 500 mesh screen) | 14.0 |
| Sodium stearate | 0.9 |

Note 1, a high molecular weight diglycidyl ether of bisphenol A. Epon 1007 from Shell Chemical Company may be used.
Note 2, a nonylphenyl ethoxylate. Rohm & Haas Triton N-57 may be used.
Note 3, GAF product Igepal CO 897 may be used.
Note 4, GAF product Antarox FL344 may be used.

The oil and aqueous phases specified above are emulsified together to provide a stable emulsion which has been found to excellently develop exposed, diazo-sensitized, lithographic printing plates.

The following example will illustrate the diversity of carbonate solvents and resins used to strengthen the image areas which may be used herein.

EXAMPLE 2

Example 1 is repeated by replacing the diglycidyl ether of bisphenol A with a corresponding weight of a solvent-soluble, hydroxy functional acrylic copolymer (Joncryl supplied by S. C. Johnson & Sons, Racine, Wisc. 53403 having an hydroxyl equivalent weight of 600 may be used). Also, the propylene glycol used in Example 1 is replaced by a corresponding weight of chloroethylene carbonate. Similar results are obtained.

What is claimed is:

1. An emulsion developer for diazo-sensitized printing plates comprising, an oil phase consisting essentially of a partially water-soluble aliphatic cyclic carbonate having the formula:

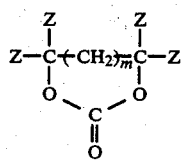

where n is an integar from 0-2, and Z is selected from hydrogen, $C_1$-$C_3$ alkyl, hydroxyl alkyl or chloroalkyl, chlorine, hydroxy or phenyl, said carbonate having dissolved therein a resinous material which adheres to the imaged areas of said printing place, surfactant to keep any pigment dispersed in said oil phase and to maintain said oil phase in emulsion, and an aqueous phase containing water having dispersed therein a protective colloid, finely divided particles, and surfactant to keep these materials in suspension in the emulsion and to prevent the emulsified oil phase from coalescing in the aqueous phase of the emulsion, said carbonate being present in an amount in excess of that needed to saturate the aqueous phase of said emulsion and sufficient to maintain said resinous material in solution in the oil phase of said emulsion.

2. An emulsion developer as recited in claim 1 in which n is zero.

3. An emulsion developer as recited in claim 1 in which said carbonate has the formula:

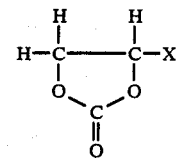

where X is selected from hydrogen, methyl and hydroxymethyl.

4. An emulsion developer as recited in claim 3 in which said carbonate is propylene carbonate.

5. An emulsion developer as recited in claim 1 in which said protective colloid is gum arabic.

6. An emulsion developer as recited in claim 1 in which said finely divided particles in said aqueous phase are provided by talc.

7. An emulsion developer as recited in claim 1 in which said resinous material in said oil phase is a diglycidyl ether of a bisphenol.

8. An emulsion developer as recited in claim 1 in which said carbonate is used in an amount of from 15% to 65%, based on the total weight of water and solvent.

9. An emulsion developer as recited in claim 8 in which said carbonate is used in an amount of from 30% to 55%.

10. An emulsion developer as recited in claim 8 in which said resinous material is used in an amount of from 0.5% to 20%, based on the weight of the carbonate solvent.

11. An emulsion developer as recited in claim 9 in which said resinous material is used in an amount of from 1.0% to 10% of the weight of the carbonate solvent.

12. An emulsion developer as recited in claim 1 in which said oil phase includes pigments which adhere with the resinous material to the imaged areas.

13. An emulsion developer for diazo-sensitized printing plates comprising, an oil phase consisting essentially of propylene carbonate having dissolved therein a resinous material which adheres to the imaged areas of said printing plate, pigments which adhere with the resinous material to the imaged areas, and surfactant to keep the pigments dispersed in said oil phase and to maintain said oil phase in emulsion, and an aqueous phase containing water having dispersed therein a protective colloid, finely divided particles, and surfactant to keep these materials in suspension in the emulsion and to prevent the emulsified oil phase from coalescing in the aqueous phase of the emulsion, said carbonate being present in an amount of from 15% to 65%, based on the total weight of water and solvent, said resinous material being used in an amount of from 0.5% to 20%, based on the weight of the carbonate solvent, and the proportion of carbonate being in excess of that needed to saturate the aqueous phase of said emulsion and sufficient to maintain said resinous material in solution in the oil phase of said emulsion.

* * * * *

UNITED STATES PATENT AND TRADEMARK OFFICE
CERTIFICATE OF CORRECTION

PATENT NO. : 4,714,670

DATED : December 22, 1987

INVENTOR(S) : Luigi Amariti et al.

It is certified that error appears in the above-identified patent and that said Letters Patent is hereby corrected as shown below:

In the formula appearing at Column 2, lines 32-38 and in Claim 1 (Column 5, lines 25-28), change the lower case "m" to: a lower case -- n --.

Signed and Sealed this

Tenth Day of May, 1988

Attest:

DONALD J. QUIGG

Attesting Officer

Commissioner of Patents and Trademarks